US011600609B2

(12) United States Patent
Sung et al.

(10) Patent No.: US 11,600,609 B2
(45) Date of Patent: Mar. 7, 2023

(54) THREE-DIMENSIONAL SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Jungtae Sung, Seoul (KR); Junyoung Choi, Seoul (KR); Jiyoung Kim, Seoul (KR); Yoonjo Hwang, Gimpo-si (KR)

(73) Assignee: Samsung Electronics Co., Ltd.

( * ) Notice: Subject to any disclaimer, the term of this patent is extended or adjusted under 35 U.S.C. 154(b) by 62 days.

(21) Appl. No.: 17/204,394

(22) Filed: Mar. 17, 2021

(65) Prior Publication Data

US 2022/0077129 A1 Mar. 10, 2022

(30) Foreign Application Priority Data

Sep. 10, 2020 (KR) .................. 10-2020-0115958

(51) Int. Cl.
*H01L 25/18* (2006.01)
*H01L 23/00* (2006.01)
*H01L 27/11529* (2017.01)
*H01L 27/11556* (2017.01)
*H01L 27/11573* (2017.01)
*H01L 27/11582* (2017.01)
(Continued)

(52) U.S. Cl.
CPC .............. *H01L 25/18* (2013.01); *H01L 24/05* (2013.01); *H01L 24/08* (2013.01); *H01L 24/80* (2013.01);
(Continued)

(58) Field of Classification Search
CPC ......... H01L 25/18; H01L 24/05; H01L 24/08; H01L 24/80; H01L 25/0657; H01L 25/50; H01L 27/11529; H01L 27/11556; H01L 27/11573; H01L 27/11582; H01L 2224/05147; H01L 2224/08145; H01L 2224/80895; H01L 2224/80896; H01L 2225/0651; H01L 2225/06541; H01L 2225/06562; H01L 2225/06586;
(Continued)

(56) References Cited

U.S. PATENT DOCUMENTS 10,600,781 B1 3/2020 Xiao et al.
2018/0358371 A1* 12/2018 Hwang ............... H01L 29/4234
(Continued)

FOREIGN PATENT DOCUMENTS

CN 109727989 A 5/2019
CN 109887920 A 6/2019
(Continued)

*Primary Examiner* — Mamadou L Diallo
(74) *Attorney, Agent, or Firm* — Myers Bigel, P.A.

(57) ABSTRACT

Disclosed are three-dimensional semiconductor memory devices and electronic systems including the same. The three-dimensional semiconductor memory device comprises a first structure and a second structure in contact with the first structure. Each of the first and second structures includes a substrate, a peripheral circuit region on the substrate, and a cell array region including a stack structure on the peripheral circuit region, a plurality of vertical structures that penetrate the stack structure, and a common source region in contact with the vertical structures. The stack structure is between the peripheral circuit region and the common source region. The common source regions of the first and second structures are connected with each other.

19 Claims, 11 Drawing Sheets

(51) Int. Cl.
*H01L 25/00* (2006.01)
*H01L 25/065* (2006.01)

(52) U.S. Cl.
CPC .......... *H01L 25/0657* (2013.01); *H01L 25/50* (2013.01); *H01L 27/11529* (2013.01); *H01L 27/11556* (2013.01); *H01L 27/11573* (2013.01); *H01L 27/11582* (2013.01); *H01L 2224/05147* (2013.01); *H01L 2224/08145* (2013.01); *H01L 2224/80895* (2013.01); *H01L 2224/80896* (2013.01); *H01L 2225/0651* (2013.01); *H01L 2225/06541* (2013.01); *H01L 2225/06562* (2013.01); *H01L 2225/06586* (2013.01); *H01L 2924/1431* (2013.01); *H01L 2924/14511* (2013.01)

(58) Field of Classification Search
CPC ... H01L 2924/1431; H01L 2924/14511; H01L 27/11575; H01L 27/1157; H01L 29/4234; H01L 29/792
See application file for complete search history.

(56) References Cited

U.S. PATENT DOCUMENTS

| | | |
|---|---|---|
| 2019/0043836 A1 | 2/2019 | Fastow et al. |
| 2020/0098776 A1 | 3/2020 | Sugisaki |
| 2020/0144242 A1* | 5/2020 | Park .................. H01L 27/11548 |
| 2020/0203329 A1* | 6/2020 | Kanamori ......... H01L 27/11573 |
| 2020/0258857 A1 | 8/2020 | Huo et al. |
| 2020/0328176 A1 | 10/2020 | Liu |
| 2020/0328188 A1* | 10/2020 | Liu .................... H01L 25/0657 |
| 2020/0365560 A1* | 11/2020 | Kanamori ......... H01L 27/11582 |
| 2021/0013088 A1* | 1/2021 | Chen ...................... H01L 24/94 |
| 2021/0013303 A1* | 1/2021 | Chen ...................... H01L 25/16 |
| 2021/0265377 A1* | 8/2021 | Chen .................. H01L 27/1157 |
| 2021/0391315 A1* | 12/2021 | Zhang ................... H01L 24/80 |
| 2022/0028829 A1* | 1/2022 | Cheng ................... H01L 25/18 |
| 2022/0077126 A1* | 3/2022 | Choi .................. H01L 27/11582 |
| 2022/0077129 A1* | 3/2022 | Sung ....................... H01L 24/05 |
| 2022/0122932 A1* | 4/2022 | Oh ........................... G11C 7/10 |

FOREIGN PATENT DOCUMENTS

| | | | |
|---|---|---|---|
| CN | 109964313 A | | 7/2019 |
| CN | 110832638 A | | 2/2020 |
| CN | 110914987 A | | 3/2020 |
| CN | 110931454 A | | 3/2020 |
| CN | 110945652 A | | 3/2020 |
| CN | 110998846 A | | 4/2020 |
| CN | 113711356 A | * | 11/2021 |
| KR | 100234002 B1 | | 12/1999 |
| KR | 20190051316 A | | 5/2019 |

\* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2020-0115958 filed on Sep. 10, 2020 in the Korean Intellectual Property Office, the disclosure of which is hereby incorporated by reference in its entirety.

BACKGROUND

The present inventive concepts relate to a three-dimensional semiconductor memory device and an electronic system including the same, and more particularly, to a three-dimensional semiconductor memory device in which structures are joined with each other, each of which includes a cell array and a peripheral circuit, and an electronic system including the three-dimensional semiconductor memory device.

A need may arise to have a semiconductor device capable of storing a large amount of data in an electronic system which may need data storage. Semiconductor devices have been highly integrated to meet high performance and low manufacturing cost, which are desired by customers. Integration of typical two-dimensional or planar semiconductor devices is primarily determined by the area occupied by a unit memory cell, such that it is greatly influenced by the level of technology for forming fine patterns. However, the expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide a three-dimensional semiconductor memory device with a reduced area, an increased cell capacity per unit area, and improved electrical characteristics.

Some example embodiments of the present inventive concepts provide an electronic system including the three-dimensional semiconductor memory device.

An object of the present inventive concepts is not limited to the mentioned above, and other objects which have not been mentioned above will be clearly understood to those skilled in the art from the following description.

According to some example embodiments of the present inventive concepts, a three-dimensional semiconductor memory device may include a first structure, and a second structure in contact with the first structure. Each of the first and second structures may include a substrate, a peripheral circuit region on the substrate, and a cell array region including a stack structure on the peripheral circuit region, a plurality of vertical structures that penetrate the stack structure, and a common source region in contact with the vertical structures. The stack structure may be between the peripheral circuit region and the common source region. The common source regions of the first and second structures may be connected with each other.

According to some example embodiments of the present inventive concepts, a three-dimensional semiconductor memory device may include a first structure, and a second structure in contact with the first structure. Each of the first and second structures may include a substrate, a peripheral circuit region including a plurality of peripheral transistors on the substrate, a plurality of peripheral circuit lines on the peripheral transistors, and a plurality of first bonding pads connected to the peripheral transistors by the peripheral circuit lines, and a cell array region including a plurality of second bonding pads which are integrally bonded with respective ones of the first bonding pads of the peripheral circuit region, a plurality of connection circuit lines on the second bonding pads, a plurality of bit lines connected to the second bonding pads through the connection circuit lines, a stack structure on the bit lines, a plurality of vertical structures that penetrate the stack structure, a common source region in contact with the vertical structures, and a source conductive pattern between the stack structure and the common source region. The stack structure may be between the peripheral circuit region and the common source region. The common source regions of the first and second structures may be connected to each other. Each of the vertical structures may be in a respective vertical channel that penetrates the stack structure. Each of the vertical structures may include a data storage pattern that conformally covers an inner wall of the respective vertical channel and a vertical semiconductor pattern surrounded by the data storage pattern. The data storage pattern may include a blocking dielectric layer, a charge storage layer, and a tunneling dielectric layer that are sequentially stacked. The source conductive pattern may be in contact with the vertical semiconductor pattern.

According to some example embodiments of the present inventive concepts, an electronic system may include a three-dimensional semiconductor memory device that includes a first structure, a second structure, and an input/output pad. Each of the first and second structures include a substrate, a peripheral circuit region on the substrate, and a cell array region including a stack structure on the peripheral circuit region, a plurality of vertical structures that penetrate the stack structure, and a common source region in contact with the vertical structures. The input/output pad is connected to the peripheral circuit region of the second structure, and a controller that is electrically connected to the three-dimensional semiconductor memory device through the input/output pad and is configured to control the three-dimensional semiconductor memory device. The stack structure may be between the peripheral circuit region and the common source region. The common source regions of the first and second structures may be connected with each other.

DETAILED DESCRIPTION

With reference to the accompanying drawings, the following will now describe in detail a three-dimensional semiconductor memory device and an electronic system including the same according to some example embodiments of the present inventive concepts.

Figure 1:
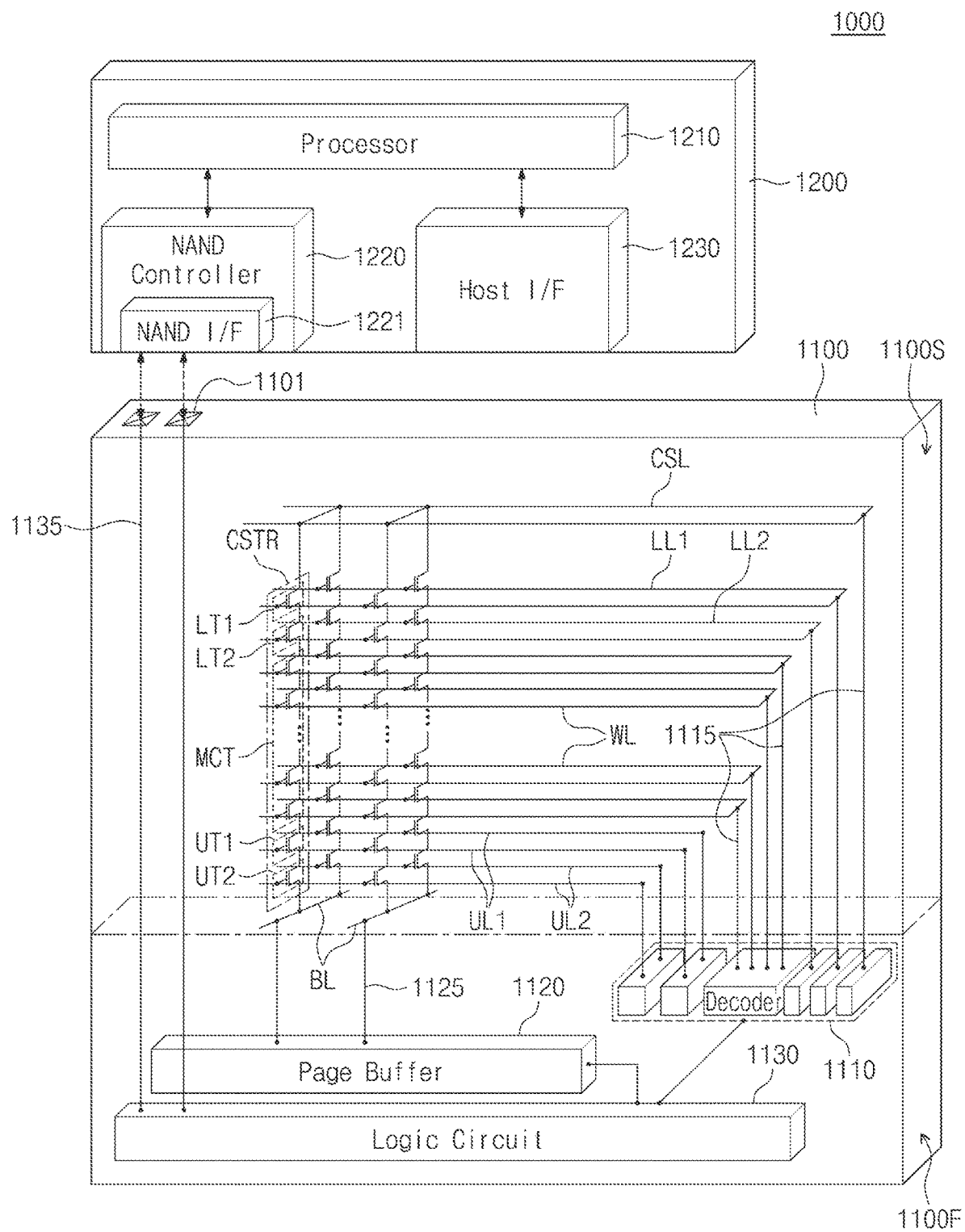
FIG. 1 illustrates a simplified block diagram showing an electronic system that includes a three-dimensional semiconductor memory device according to some example embodiments of the present inventive concepts.

FIG. 1 illustrates a simplified block diagram showing an electronic system that includes a three-dimensional semiconductor memory device according to some example embodiments of the present inventive concepts.

Referring to FIG. 1, an electronic system 1000 according to some example embodiments of the present inventive concepts may include a three-dimensional semiconductor memory device 1100 and a controller 1200 electrically connected to the three-dimensional semiconductor memory device 1100. The electronic system 1000 may be a storage device that includes a single or a plurality of three-dimensional semiconductor memory devices 1100 or may be an electronic device that includes the storage device. For example, the electronic system 1000 may be a solid state drive (SSD) device, a computing system, a medical apparatus, or a communication apparatus, each of which includes a single or a plurality of three-dimensional semiconductor memory devices 1100.

The three-dimensional semiconductor memory device 1100 may be a non-volatile memory device, such as a three-dimensional NAND Flash memory device which will be discussed below. The three-dimensional semiconductor memory device 1100 may include a first region 1100F and a second region 1100S on the first region 1100F. In some embodiments, different from that shown, the first region 1100F may be disposed on a side of the second region 1100S. The first region 1100F may be a peripheral circuit region that includes a decoder circuit 1110, a page buffer 1120, and a logic circuit 1130. The second region 1100S may be a memory cell region that includes bit lines BL, a common source line CSL, word lines WL, first lines LL1 and LL2, second lines UL1 and UL2, and memory cell strings CSTR between the bit line BL and the common source line CSL.

On the second region 1100S, each of the memory cell strings CSTR may include first transistors LT1 and LT2 adjacent to the common source line CSL, second transistors UT1 and UT2 adjacent to the bit line BL, and memory cell transistors MCT disposed between the first transistors LT1 and LT2 and the second transistors UT1 and UT2. The number of the first transistors LT1 and LT2 and of the second transistors UT1 and UT2 may be variously changed in accordance with embodiments. The memory cell strings CSTR may be positioned, for example, between the common source line CSL and the first region 1100F.

For example, the second transistors UT1 and UT2 may include a string selection transistor, and the first transistors LT1 and LT2 may include a ground selection transistor. The first lines LL1 and LL2 may be gate electrodes of the first transistors LT1 and LT2, respectively. The word lines WL may be gate electrodes of the memory cell transistors MCT, and the second lines UL1 and UL2 may be gate electrodes of the second transistors UT1 and UT2, respectively.

For example, the first transistors LT1 and LT2 may include a first erase control transistor LT1 and a ground selection transistor LT2 that are connected in series. For example, the second transistors UT1 and UT2 may include a string selection transistor UT1 and a second erase control transistor UT2 that are connected in series. One or both of the first and second erase control transistors LT1 and UT2 may be employed to perform an erasure operation in which a gate induced drain leakage (GIDL) phenomenon is used to erase data stored in the memory cell transistors MCT.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

On the first region 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. According to some example embodiments, the electronic system 1000 may include a plurality of three-dimensional semiconductor memory devices 1100, and in this case, the controller 1200 may control the plurality of three-dimensional semiconductor memory devices 1100.

The processor 1210 may control overall operations of the electronic system 1000 including the controller 1200. The processor 1210 may operate based on predetermined firmware, and may control the NAND controller 1220 to access the three-dimensional semiconductor memory device 1100. The NAND controller 1220 may include a NAND interface 1221 that processes communication with the three-dimensional semiconductor memory device 1100. The NAND interface 1221 may be used to transfer therethrough a control command to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
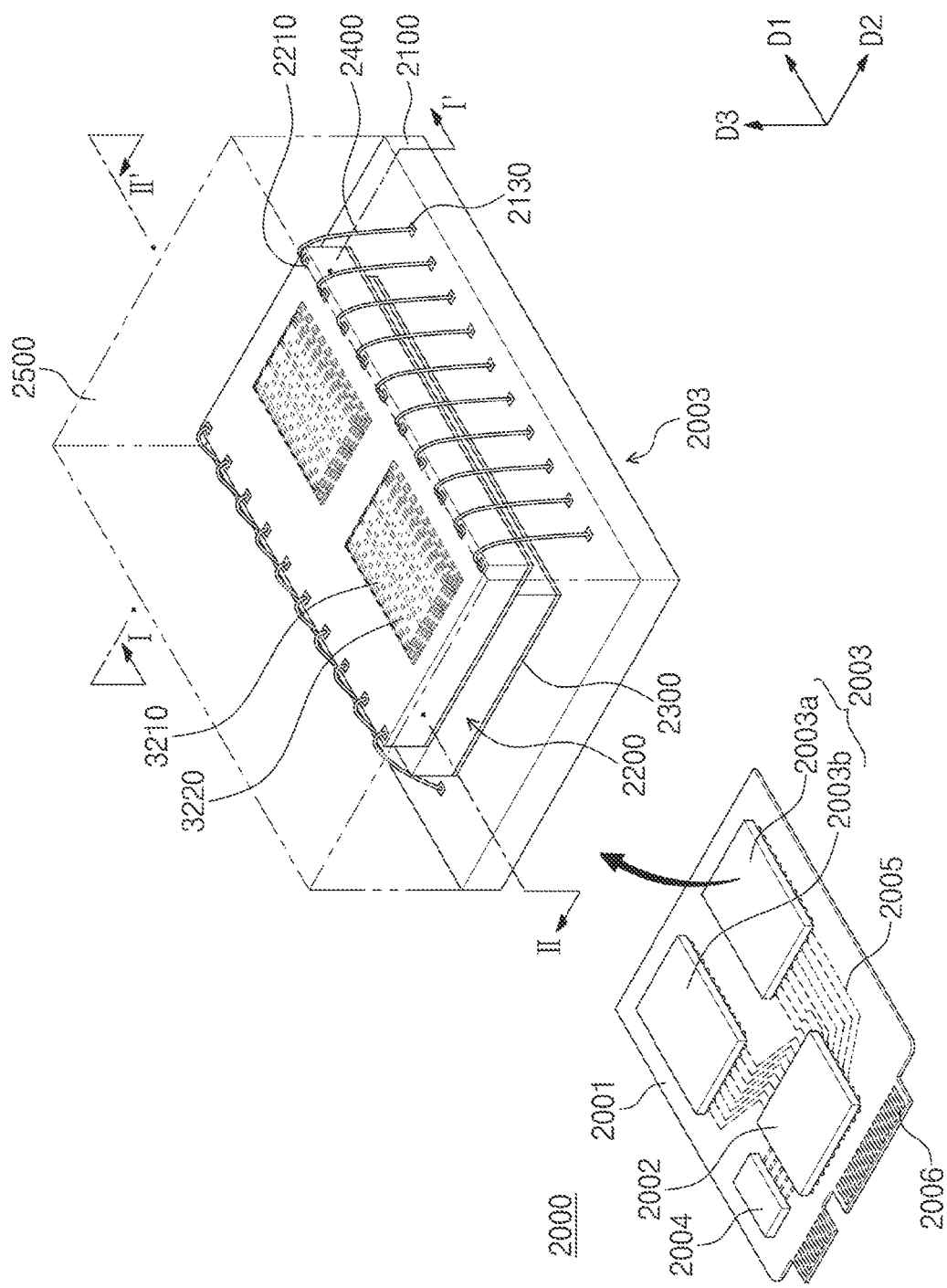
FIG. 2 illustrates a simplified perspective view showing an electronic system that includes a three-dimensional semiconductor memory device according to some example embodiments of the present inventive concepts.

FIG. 2 illustrates a simplified perspective view showing an electronic system that includes a three-dimensional semiconductor memory device according to some example embodiments of the present inventive concepts.

Referring to FIG. 2, an electronic system 2000 according to some example embodiments of the present inventive concepts may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins which are provided to have connection with an external host. The number and arrangement of the plurality of pins on the connector 2006 may be changed based on a communication interface between the electronic system 2000 and the external host. The electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). For example, the electronic system 2000 may operate with power supplied through the connector 2006 from the external host. The electronic system 2000 may further include a power management integrated circuit (PMIC) that distributes the power supplied from the external host to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for control of the semiconductor package 2003, but a DRAM controller for control of the DRAM 2004.

The semiconductor package 2003 may include a first semiconductor package 2003*a* and a second semiconductor package 2003*b* that are spaced apart from each other. Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesive layers 2300 on bottom surfaces of the semiconductor chips 2200, connection structures 2400 that electrically connect the semiconductor chips 2200 to the package substrate 2100, and a molding layer 2500 that lies on the package substrate 2100 and covers or overlaps the semiconductor chips 2200 and the connection structures 2400.

The package substrate 2100 may be an integrated circuit board including package upper pads 2130. For example, the package substrate 2100 may have a top surface that is parallel to first and second directions D1 and D2 and perpendicular to a third direction D3. The first to third directions D1 to D3 may be orthogonal to each other. Each of the semiconductor chips 2200 may include input/output pads 2210. The input/output pads 2210 may correspond to the input/output pad 1101 of FIG. 1. Each of the semiconductor chips 2200 may include gate stack structures 3210 and memory channel structures 3220. Each of the semiconductor chips 2200 may include a three-dimensional semiconductor memory device which will be discussed below.

The connection structures 2400 may be, for example, bonding wires that electrically connect the input/output pads 2210 to the package upper pads 2130. Therefore, on each of the first and second semiconductor packages 2003*a* and 2003*b*, the semiconductor chips 2200 may be electrically connected to each other in a wire bonding manner, and may be electrically connected to the package upper pads 2130 of the package substrate 2100. In some example embodiments, on each of the first and second semiconductor packages 2003*a* and 2003*b*, the semiconductor chips 2200 may be electrically connected to each other using through-silicon vias instead of the connection structures 2400 or the bonding wires.

Differently from that shown in FIG. 2, in some embodiments, the controller 2002 and the semiconductor chips 2200 may be included in a single package. The controller 2002 and the semiconductor chips 2200 may be mounted on a separate interposer substrate other than the main board 2001, and may be connected to each other through wiring lines provided in the interposer substrate.

Figure 3:
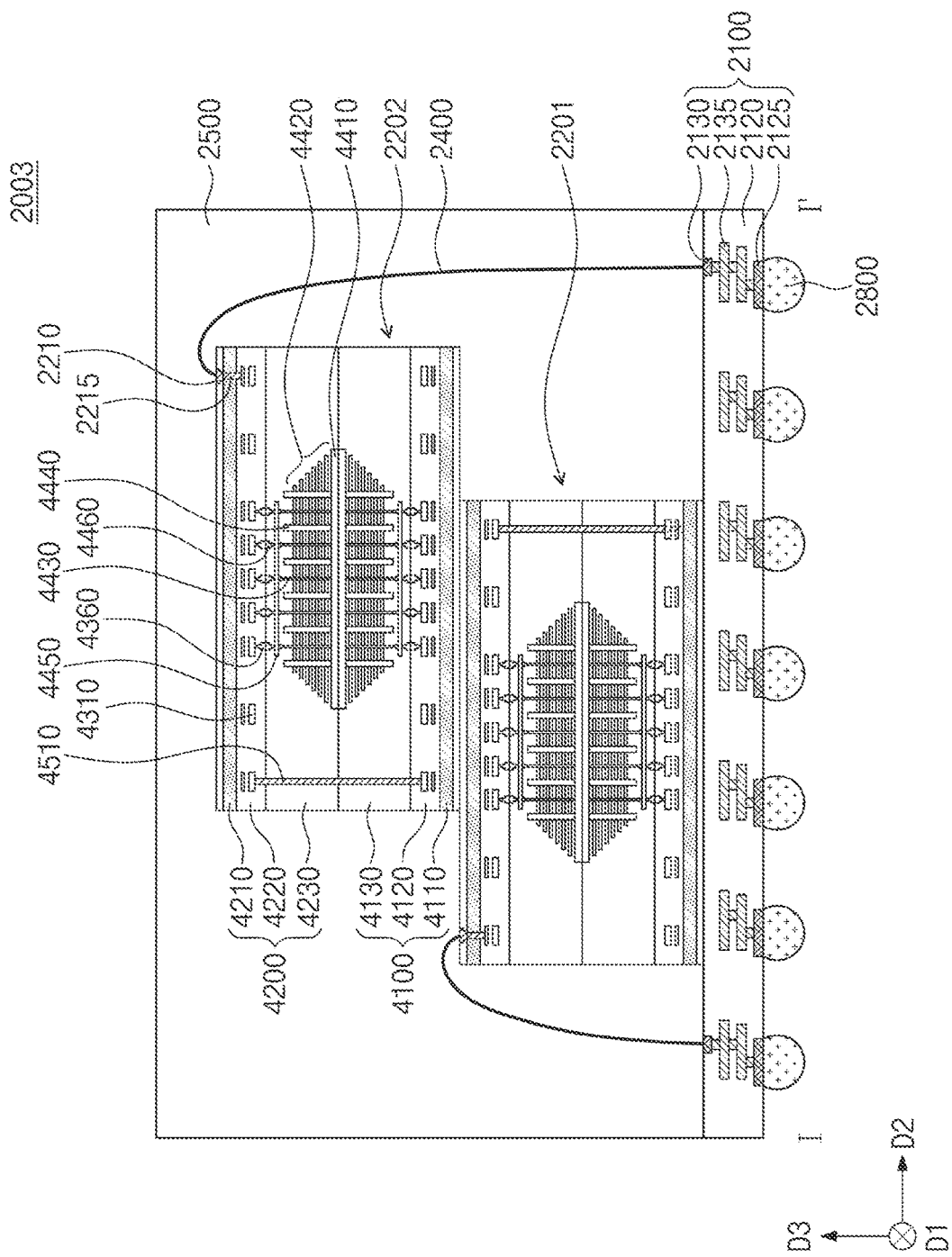
FIGS. 3 and 4 illustrate cross-sectional views respectively taken along lines I-I' and II-II' of FIG. 2, showing a semiconductor package that includes a three-dimensional semiconductor memory device according to some example embodiments of the present inventive concepts.
Figure 4:
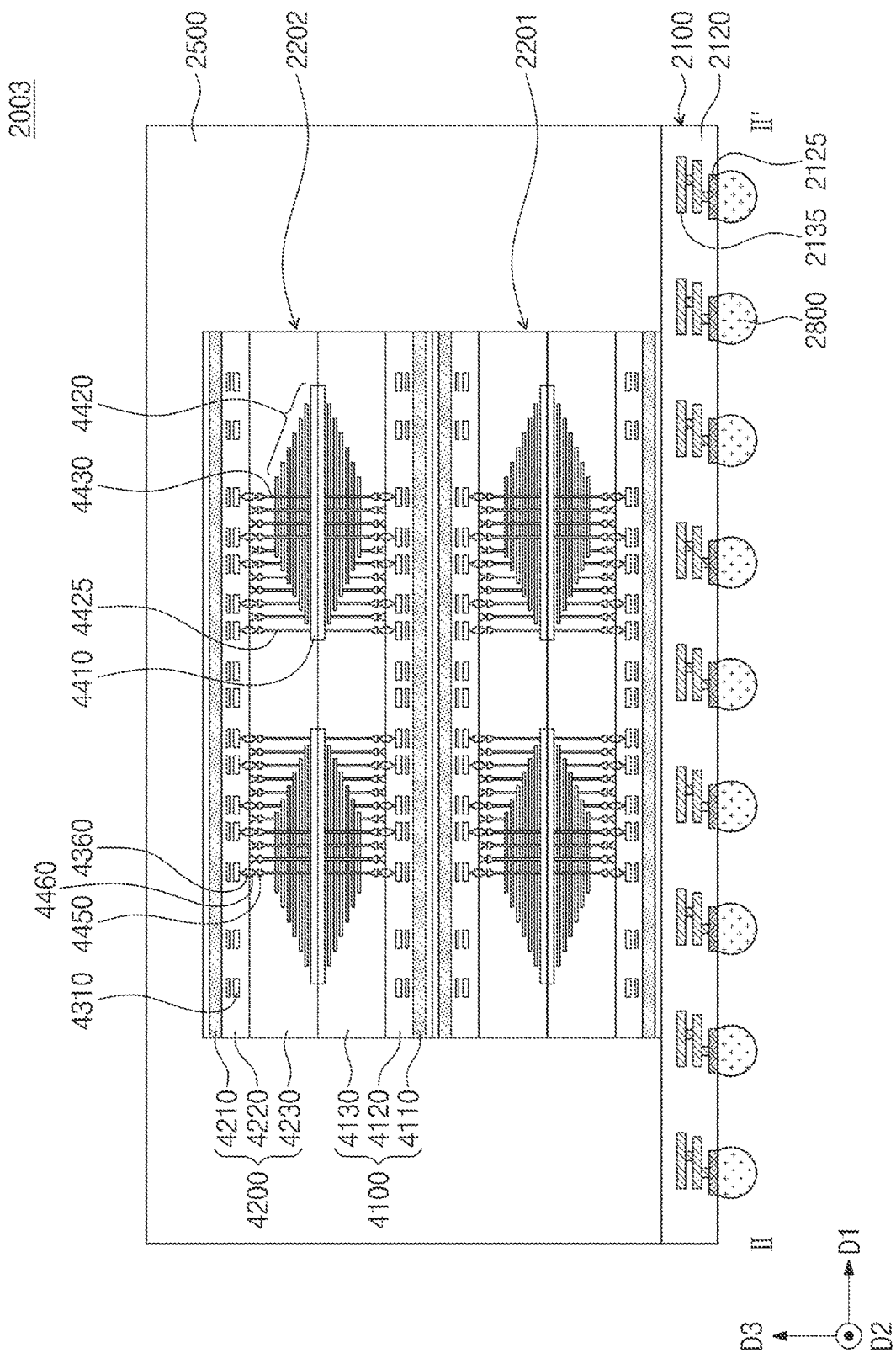

FIGS. 3 and 4 illustrate cross-sectional views respectively taken along lines I-I' and II-II' of FIG. 2, showing a semiconductor package that includes a three-dimensional semiconductor memory device according to some example embodiments of the present inventive concepts.

Referring to FIGS. 3 and 4, a semiconductor package 2003 may include a package substrate 2100, a plurality of semiconductor chips on the package substrate 2100, and a molding layer 2500 that covers or overlaps the package substrate 2100 and the plurality of semiconductor chips.

The package substrate 2100 may include a package substrate body 2120, package upper pads 2130 on a top surface of the package substrate body 2120, package lower pads 2125 disposed or exposed on a bottom surface of the package substrate body 2120, and internal wiring lines 2135 that lie in the package substrate body 2120 and electrically connect the package upper pads 2130 to the package lower pads 2125. The package upper pads 2130 may be electrically connected to connection structures 2400. The package lower pads 2125 may be connected through conductive connectors 2800 to the wiring patterns 2005 in the main board 2001 of the electronic system 2000 depicted in FIG. 2.

The semiconductor package 2003 may include, for example, a first semiconductor chip 2201 and a second semiconductor chip 2202 on the first semiconductor chip 2201. The present inventive concepts, however, are not limited thereto, and the semiconductor package 2003 may include three or more semiconductor chips. The first and second semiconductor chips 2201 and 2202 may have a step difference therebetween. For example, a sidewall perpendicular to the first direction D1 of the second semiconductor chip 2202 may be aligned with a sidewall perpendicular to the first direction D1 of the first semiconductor chip 2201, and a sidewall perpendicular to the second direction D2 of the second semiconductor chip 2202 may not be aligned with a sidewall perpendicular to the second direction D2 of the first semiconductor chip 2201. The first and second semiconductor chips 2201 and 2202 may include substantially the same components.

Each of the first and second semiconductor chips 2201 and 2202 may include a first structure 4100 and a second structure 4200 on the first structure 4100. The first structure 4100 may include a first substrate 4110, a first peripheral circuit region 4120, and a first cell array region 4130 that are stacked in the third direction D3. The second structure 4200 may include a second cell array region 4230, a second peripheral circuit region 4220, and a second substrate 4210 that are stacked in the third direction D3 on the first structure 4100. The first and second structures 4100 and 4200 may have their structures that are symmetrical to each other about a contact surface therebetween.

The first and second structures 4100 and 4200 may be joined with each other through their own common source line 4410 which will be discussed below with reference to FIGS. 5 to 11. The first peripheral circuit region 4120 and the first cell array region 4130 may be bonded with each other in a wafer bonding manner, and likewise the second peripheral circuit region 4220 and the second cell array region 4230 may be bonded with each other in a wafer bonding manner. The first peripheral circuit region 4120 and the second peripheral circuit region 4220 may be connected to each other through a peripheral circuit connection line 4510. The peripheral circuit connection line 4510 may penetrate the first and second cell array regions 4130 and 4230.

Each of the first and second peripheral circuit regions 4120 and 4220 may include peripheral circuit lines 4310 and first bonding structures 4360. Each of the first and second cell array regions 4130 and 4230 may include a common source line 4410, a gate stack structure 4420 between the common source line 4410 and the peripheral circuit lines 4310, memory channel structures 4430 and a separation structure 4440 all of which penetrate the gate stack structure 4420, and second bonding structures 4460 that are correspondingly electrically connected to the memory channel structures 4430 and word lines (see WL of FIG. 1) of the gate stack structure 4420. For example, the second bonding structures 4460 may be correspondingly electrically connected to the memory channel structures 4430 and the word lines WL through bit lines 4450 electrically connected to the memory channel structures 4430 and through gate connection lines 4425 electrically connected to the word lines WL. The first bonding structures 4360 may be in contact with and coupled to the second bonding structures 4460. The first and second bonding structures 4360 and 4460 may have their contact portions including, for example, copper (Cu).

Each of the first and second semiconductor chips 2201 and 2202 may further include input/output pads 2210 and input/output connection lines 2215 below the input/output pads 2210. The input/output connection line 2215 may be electrically connected one of the peripheral circuit lines 4310. The input/output pads 2210 on the first and second semiconductor chips 2201 and 2202 may be electrically connected through the bonding-wire-typed connection structures 2400 to the package upper pads 2130 on the package substrate 2100. The present inventive concepts, however, are not limited thereto, and differently from that shown, the first and second semiconductor chips 2201 and 2202 may be electrically connected to each other through connection structures shaped like through electrodes.

Figure 5:
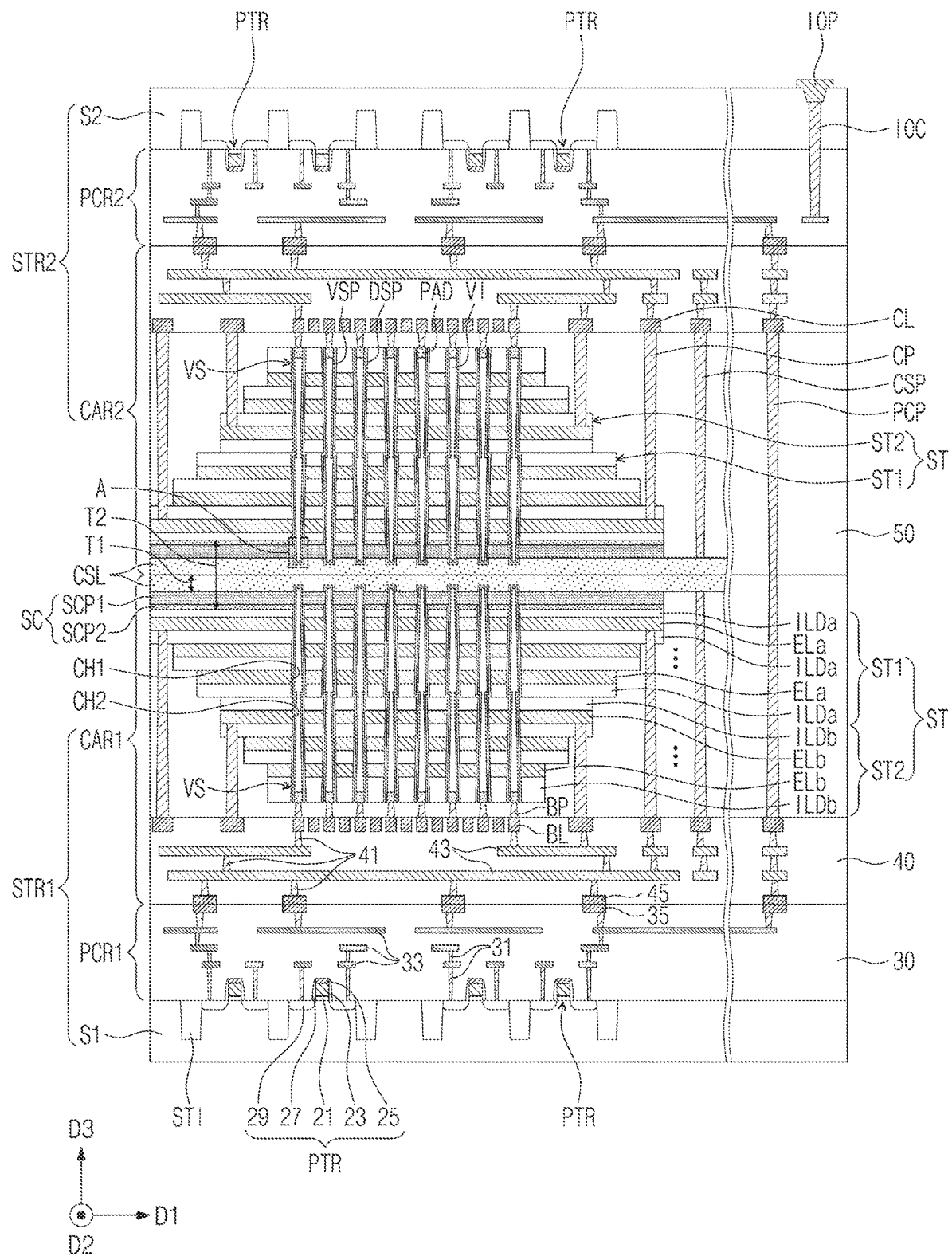
FIG. 5 illustrates a cross-sectional view showing a three-dimensional semiconductor memory device according to some example embodiments of the present inventive concepts.

FIG. 5 illustrates a cross-sectional view of a part of FIG. 4, showing a three-dimensional semiconductor memory device according to some example embodiments of the present inventive concepts.

Referring to FIG. 5, a three-dimensional semiconductor memory device may include a first structure STR1 and a second structure STR2 on the first structure STR1. In this description below, the phrase "a certain component is provided on a different component" may mean that the certain component is provided above or below (in the third direction D3 or a direction opposite to the third direction D3). The first structure STR1 and the second structure STR2 may respectively correspond to the first structure 4100 and the second structure 4200 of FIGS. 3 and 4. The following will describe detailed components of the first structure STR1, and detailed components of the second structure STR2 may be substantially the same as those of the first structure STR1. For example, the first and second structures STR1 and STR2 may have their structures that are symmetrical to each other about a contact surface therebetween, and may have their detailed components that are substantially the same as each other. The detailed components of the first structure STR1 may each have bottom and top surfaces (lower and upper portions) that are understood as top and bottom surfaces (upper and lower portions) of a corresponding one of the detailed components of the second structure STR2.

The first structure STR1 may include a first substrate S1, a first peripheral circuit region PCR1 on the first substrate S1, and a first cell array region CAR1 on the first peripheral circuit region PCR1.

The first substrate S1 may be, for example, a silicon substrate, a silicon-germanium substrate, a germanium substrate, or a monocrystalline epitaxial layer grown on a monocrystalline silicon substrate. The first substrate S1 may have a top surface parallel to first and second directions D1 and D2. A device isolation layer STI may be provided in the first substrate S1. The device isolation layer STI may define an active region of the first substrate S1.

The first peripheral circuit region PCR1 may include peripheral transistors PTR on the active region of the first substrate S1, peripheral contact plugs 31, peripheral circuit lines 33 electrically connected through the peripheral contact plugs 31 to the peripheral transistors PTR, first bonding pads 35 electrically connected to the peripheral circuit lines 33, and a peripheral circuit dielectric layer 30 that surrounds the peripheral transistors PTR, the peripheral contact plugs 31, the peripheral circuit lines 33, and the first bonding pads 35.

For example, the peripheral contact plugs 31 may each have a width in the first direction D1 or the second direction D2 that increases in a third direction D3. In contrast, the peripheral contact plugs 31 in a second peripheral circuit region PCR2 may each have a width in the first direction D1 or the second direction D2 that decreases in the third direction D3. The peripheral contact plugs 31 and the peripheral circuit lines 33 may include a conductive material, such as metal.

The peripheral transistors PTR may constitute, for example, a decoder circuit (see 1100 of FIG. 1), a page buffer (see 1120 of FIG. 1), and a logic circuit (see 1130 of FIG. 1). For example, each of the peripheral transistors PTR may include a peripheral gate dielectric layer 21, a peripheral gate electrode 23, a peripheral capping pattern 25, a peripheral gate spacer 27, and peripheral source/drain regions 29. The peripheral gate dielectric layer 21 may be provided between the peripheral gate electrode 23 and the first substrate S1. The peripheral capping pattern 25 may be provided on the peripheral gate electrode 23. The peripheral gate spacer 27 may cover or overlap a sidewall of the peripheral gate dielectric layer 21, of the peripheral gate electrode 23, and of the peripheral capping pattern 25. The peripheral source/drain regions 29 may be provided in the first substrate S1 adjacent to opposite sides of the peripheral gate electrode 23. The peripheral circuit lines 33 and the first bonding pads 35 may be electrically connected through the peripheral contact plugs 31 to the peripheral transistors PTR. Each of the peripheral transistors PTR may be, for example, an NMOS transistor, a PMOS transistor, or a gate-all-around type transistor.

The peripheral circuit dielectric layer 30 may be provided on a top surface of the first substrate S1. On the first substrate S1, the peripheral circuit dielectric layer 30 may cover or overlap the peripheral transistors PTR, the peripheral contact plugs 31, and the peripheral circuit lines 33. The peripheral circuit dielectric layer 30 may include a plurality of dielectric layers that constitutes a multi-layered structure. For example, the peripheral circuit dielectric layer 30 may include one or more of silicon oxide, silicon nitride, silicon oxynitride, and/or low-k materials. The peripheral circuit dielectric layer 30 may not cover or overlap top surfaces of the first bonding pads 35. The peripheral circuit dielectric layer 30 may have a top surface substantially coplanar with those of the first bonding pads 35.

The first peripheral circuit region PCR1 may be provided thereon with the first cell array region CAR1 that includes a first dielectric layer 40 and a second dielectric layer 50 on the first dielectric layer 40. The first dielectric layer 40 may be provided therein with bit lines BL that extend in the second direction D2 and are spaced apart from each other in the first direction D1, conductive lines CL that extend in the second direction D2 and are spaced apart from each other in the first direction D1, connection contact plugs 41 connected to the bit lines BL or the conductive lines CL, connection circuit lines 43 electrically connected through the connection contact plugs 41 to the bit lines BL or the conductive lines CL, and second bonding pads 45 in contact with the first bonding pads 35 of the first peripheral circuit region PCR1. The first dielectric layer 40 may include a plurality of dielectric layers that constitute a multi-layered structure. For example, the first dielectric layer 40 may include one or more of silicon oxide, silicon nitride, silicon oxynitride, and/or low-k materials.

For example, the connection contact plugs 41 may each have a width in the first direction D1 or the second direction D2 that decreases in the third direction D3. In contrast, the connection contact plugs 41 in a second peripheral circuit region PCR2 may each have a width in the first direction D1 or the second direction D2 that increases in the third direction D3. The connection contact plugs 41 and the connection circuit lines 43 may include a conductive material, such as metal.

The first dielectric layer 40 may not cover or overlap bottom surfaces of the second bonding pads 45. The first dielectric layer 40 may have a bottom surface substantially coplanar with those of the second bonding pads 45. The bottom surfaces of the second bonding pads 45 may directly contact the top surfaces of the first bonding pads 35. The first and second bonding pads 35 and 45 may include metal, such as copper (Cu), tungsten (W), aluminum (Al), nickel (Ni), or tin (Sn). For example, the first and second bonding pads 35 and 45 may include copper (Cu). The first and second bonding pads 35 and 45 may constitute a single unitary shape without a boundary therebetween. The first and second bonding pads 35 and 45 are illustrated to have their sidewalls aligned with each other, but the present inventive concepts are not limited thereto. For example, when viewed in plan, the first and second bonding pads 35 and 45 may have their sidewalls spaced apart from each other.

The second dielectric layer 50 may be provided therein with a stack structure that includes interlayer dielectric layers ILDa and ILDb and gate electrodes ELa and ELb that are alternately stacked, a source structure SC on the stack structure ST, and vertical structures VS that penetrate the stack structure ST and the source structure SC. The second dielectric layer 50 may include a plurality of dielectric layers that constitute a multi-layered structure. For example, the second dielectric layer 50 may include one or more of silicon oxide, silicon nitride, silicon oxynitride, and/or low-k materials.

Bit-line contact plugs BP may connect the vertical structures VS to the bit lines BL. Cell contact plugs CP may connect the conductive lines CL to the gate electrodes ELa and ELb of the stack structure ST. A common source contact plug CSP may connect a common source region CSL to one of the conductive lines CL.

A peripheral connection contact plug PCP that penetrates the second dielectric layer 50 may be spaced apart from the stack structure ST, the common source region CSL, and the common source contact plug CSP, and the peripheral connection contact plug PCP of the first structure STR1 may be in contact with and electrically connected to the peripheral connection contact plug PCP of the second structure STR2. As the peripheral connection contact plug PCP of the first structure STR1 is connected to the peripheral connection contact plug PCP of the second structure STR2, the first peripheral circuit region PCR1 of the first structure STR1 may be electrically connected to a second peripheral circuit region PCR2 of the second structure STR2. As the first peripheral circuit region PCR1 is connected to a second peripheral circuit region PCR2, it may be possible to effectively dispose peripheral circuits and to decrease an overall area of a three-dimensional semiconductor memory device.

The bit-line contact plug BP on the bit line BL, the cell contact plug CP on the conductive line CL, the common source contact plug CSP, and the peripheral connection contact plug PCP may each have a width in the first direction D1 or the second direction D2 that decreases in the third direction D3. In contrast, on the second cell array region CAR2, the bit-line contact plug BP, the cell contact plug CP, the common source contact plug CSP, and the peripheral connection contact plug PCP may each have a width in the direction D1 or the second direction D2 that increases in the third direction D3. The bit-line contact plug BP, the cell contact plug CP, the common source contact plug CSP, and the peripheral connection contact plug PCP may include a conductive material, such as metal.

The stack structure ST may include a first stack structure ST1 and a second stack structure ST2 between the first stack structure ST1 and the first dielectric layer 40. The first stack structure ST1 may include first interlayer dielectric layers ILDa and first gate electrodes ELa that are alternately stacked, and the second stack structure ST2 may include second interlayer dielectric layers ILDb and second gate electrodes ELb that are alternately stacked.

The first and second gate electrodes ELa and ELb may include, for example, one or more of doped semiconductors (e.g., doped silicon), metals (e.g., tungsten, copper, or aluminum), conductive metal nitrides (e.g., titanium nitride, or tantalum nitride), and/or transition metals (e.g., titanium or tantalum). The first and second interlayer dielectric layers ILDa and ILDb may include one or more of silicon oxide, silicon nitride, silicon oxynitride, and/or low-k materials. For example, the first and second interlayer dielectric layers ILDa and ILDb may include high density plasma (HDP) oxide or tetraethyl orthosilicate (TEOS).

The first stack structure ST1 may be provided between the source structure SC and the first substrate S1, and the second stack structure ST2 may be provided between the first stack structure ST1 and the first substrate S1. For example, the second stack structure ST2 may be provided on a bottom surface of a lowermost one of the first interlayer dielectric layers ILDa included in the first stack structure ST1. An uppermost one of the second interlayer dielectric layers ILDb included in the second stack structure ST2 may contact the lowermost first interlayer dielectric layer ILDa of the first stack structure ST1.

Each of the first and second stack structures ST1 and ST2 may have a thickness in the third direction D3 that decreases with increasing distance from an outermost one of the vertical structures VS. In such cases, each of the first and second stack structures ST1 and ST2 may have a stepwise structure in the first direction D1 and in a direction opposite to the first direction D1. For example, the first gate electrodes ELa of the first stack structure ST1 and the second gate electrodes ELb of the second stack structure ST2 may have their lengths in the first direction D1 that increase with increasing distance from the first substrate S1. In addition, the first gate electrodes ELa of the first stack structure ST1 and the second gate electrodes ELb of the second stack structure ST2 may have their lengths in the first direction D1 that decrease with increasing distance from the common source region CSL. When viewed in plan, the first and second gate electrodes ELa and ELb may have their sidewalls that are spaced apart from each other at a constant interval in the first direction D1 or in a direction opposite to the first direction D1. A lowermost one of the first gate electrodes ELa included in the first stack structure ST1 may have the smallest length in the first direction D1, and an uppermost one of the second gate electrodes ELb included in the second stack structure ST2 may have the largest length in the first direction D1.

The first and second interlayer dielectric layers ILDa and ILDb may be provided between the first and second gate electrodes ELa and ELb, and may each have a sidewall aligned with that of an overlaying one of the first and second gate electrodes ELa and ELb. For example, likewise the first and second gate electrodes ELa and ELb, the first and second interlayer dielectric layers ILDa and ILDb may have their lengths in the first direction D2 that increase with increasing distance from the first substrate S1. A lowermost one of the second interlayer dielectric layers ILDb may have a thickness in the third direction D3 greater than a thickness of any other of the second interlayer dielectric layers ILDb, and an uppermost one of the first interlayer dielectric layers ILDa may have a thickness in the third direction D3 less than a thickness of any other of the first interlayer dielectric layers ILDa, but the present inventive concepts are not limited thereto.

Each of the bit-line contact plugs BP may penetrate the second dielectric layer 50 to come into contact with one of the vertical structures VS, and each of the cell contact plugs CP may penetrate one of the first and second interlayer dielectric layers ILDa and ILDb to come into contact with one of the first and second gate electrodes ELa and ELb. The common source contact plug CSP may penetrate the second dielectric layer 50 to come into contact with the common source region CSL. The peripheral connection contact plug PCP of the first structure STR1 may penetrate the second dielectric layer 50 to come into contact with the peripheral connection contact plug PCP of the second structure STR2. The cell contact plugs CP, the common source contact plugs CSP, and the peripheral connection contact plug PCP may be spaced apart from each other in the first direction D1.

The vertical structures VS may be provided in first vertical channels CH1 that penetrate in the third direction D3 through the first stack structure ST1 and the source structure SC, and also be provided in second vertical channels CH2 that penetrate in the third direction D3 through the second stack structure ST2. The first and second vertical channels CH1 and CH2 may be connected to each other. The first and second vertical channels CH1 and CH2 may have their diameters different from each other at a boundary therebetween. For example, each of the second vertical channels CH2 may have a diameter that is less at its upper portion than at its lower portion. In other words, the diameters of the first and second vertical channels CH1 and CH2 decrease closer to the common source region CSL. A step difference may be provided at a boundary between the first and second vertical channels CH1 and CH2. The present inventive concepts, however, are not limited thereto, and differently from that shown, one of the vertical structures VS may be provided in three or more vertical channels that have a step difference at each of two or more boundaries therebetween, and one of the vertical structures VS may be provided in one vertical channel that has a flat sidewall with no step difference.

As discussed with reference to FIG. 6, a portion of the source structure SC may protrude into the first vertical channel CH1. Each of the first and second vertical channels CH1 and CH2 may have a width in the first direction D1 or the second direction D2 that decreases with increasing distance from the first substrate S1. In addition, each of the first and second vertical channels CH1 and CH2 may have a width in the first direction D1 or the second direction D2 that increases with increasing distance from the common source region CSL. In contrast, each of the first and second vertical channels CH1 and CH2 on the second cell array region CAR2 may have a width in the first direction D1 or the second direction D2 that increases in the third direction D3.

Each of the vertical structures VS may include a conductive pad PAD in contact with a corresponding one of the bit-line contact plugs BP, a data storage pattern DSP that conformally covers, contacts, or overlaps an inner wall of each of the first and second vertical channels CH1 and CH2, a vertical semiconductor pattern VSP that conformally covers, contacts, or overlaps a sidewall of the data storage pattern DSP, and a buried dielectric pattern VI that fill an inner space of each of the first and second vertical channels CH1 and CH2, which inner space is surrounded by the vertical semiconductor pattern VSP and the conductive pad PAD. The vertical semiconductor pattern VSP may be surrounded by the data storage pattern DSP. The vertical structures VS may each have a top or bottom surface that has, for example, a circular, oval, or bar shape.

The vertical semiconductor pattern VSP may be provided between the data storage pattern DSP and the buried dielectric pattern VI and between the data storage pattern DSP and the conductive pad PAD. The vertical semiconductor pattern VSP may have a macaroni shape or a pipe shape whose bottom end is closed. The data storage pattern DSP may have a macaroni shape or a pipe shape whose bottom end is opened. The vertical semiconductor pattern VSP may include, for example, an impurity-doped semiconductor material, an impurity-undoped intrinsic semiconductor material, or a polycrystalline semiconductor material. The conductive pad PAD may include, for example, an impurity-doped semiconductor material or a conductive material.

The source structure SC on the stack structure ST may extend in the first direction D1 parallel to the first and second gate electrodes ELa and ELb of the stack structure ST. The source structure SC may include a first source conductive pattern SCP1 and a second source conductive pattern SCP2 between the first source conductive pattern SCP1 and the stack structure ST. The second source conductive pattern SCP2 may be provided between the first source conductive pattern SCP1 and the uppermost first interlayer dielectric layer ILDa of the first stack structure ST1. The second source conductive pattern SCP2 may directly contact the first source conductive pattern SCP1. The first source conductive pattern SCP1 may have a thickness in the third direction D3 greater than a thickness in the third direction D3 of the second source conductive pattern SCP2. Each of the first and second source conductive patterns SCP1 and SCP2 may include an impurity-doped semiconductor material. For example, each of the first and second source conductive patterns SCP1 and SCP2 may include a semiconductor material doped with N-type impurities. For example, the first source conductive pattern SCP1 may have an impurity concentration greater than that of the second source conductive pattern SCP2. Differently from that shown, an oxide layer may be interposed between the first source conductive pattern SCP1 and the second source conductive pattern SCP2 and between the first source conductive pattern SCP1 and the common source region CSL.

The common source region CSL may be provided on the source structure SC and the vertical structures VS. The common source region CSL may have, for example, a plate shape that extends in the first direction D1 and the second direction D2. The common source region CSL may include, for example, an impurity-doped semiconductor material. For example, the common source region CSL may have the same conductivity type (e.g., N-type) as that of the source structure SC. The common source region CSL may correspond to the common source line CSL of FIG. 1 or the common source line 4410 of FIGS. 3 and 4. The common source region CSL may have a first thickness T1, ranging from about 3 kÅ to about 10 kÅ, which is defined to refer to a thickness in the third direction D3. The first thickness T1 may range, for example, from about 4 kÅ to about 7 kÅ.

The common source region CSL on the stack structure ST of the first cell array region CAR1 may be joined with the common source region CSL of the second cell array region CAR2. A second thickness T2 may be defined to refer to an overall thickness in the third direction D3 of the source structures SC and the common source regions CSL included in the first and second cell array regions CAR1 and CAR2, and the second thickness T2 may be about 2 to 4 times the first thickness T1. For example, the second thickness T2 may range from about 10 kÅ to about 40 kÅ.

A second cell array region CAR2, a second peripheral circuit region PCR2, and a second substrate S2 of the second structure STR2 provided on the first cell array region CAR1 may respectively correspond to and have substantially the same detailed components as those of the first cell array region CAR1, the first peripheral circuit region PCR1, and the first substrate S1 of the first structure STR1, but may be stacked in a direction opposite to a direction in which the first cell array region CAR1, the first peripheral circuit region PCR1, and the first substrate S1 are stacked (i.e., rotated 180°). The following will focus on differences between the first structure STR1 and the second structure STR2.

An input/output connection line IOC may be provided to penetrate the second substrate S2 and a portion of the peripheral circuit dielectric layer 30 of the peripheral circuit region PCR2. The input/output connection line IOC may be connected to one of the peripheral circuit lines 33 of the second peripheral circuit region PCR2. The input/output connection line IOC may correspond to the input/output connection line 1135 of FIG. 1 or the input/output connection line 2215 of FIG. 4. An input/output pad IOP may be provided on the input/output connection line IOC. A portion of the input/output pad IOP may protrude from a top surface of the second substrate S2, but the present inventive concepts are not limited thereto. The input/output pad IOP may correspond to the input/output pad 1101 of FIG. 1 or one of the input/output pads 2210 of FIGS. 3 and 4.

Figure 6:
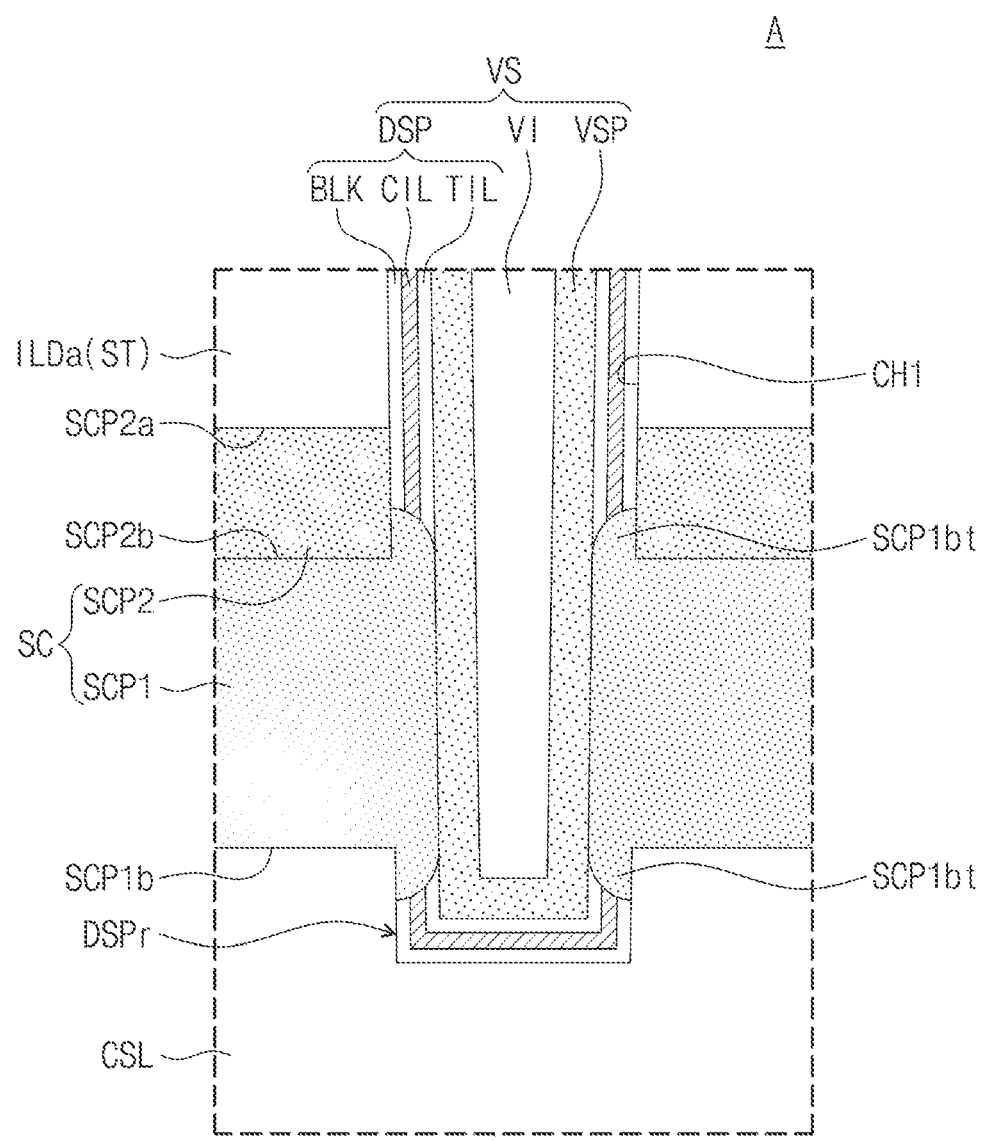
FIG. 6 illustrates an enlarged view of section A depicted in FIG. 5, partially showing a three-dimensional semiconductor memory device according to some example embodiments of the present inventive concepts.

FIG. 6 illustrates an enlarged view of section A depicted in FIG. 5, partially showing a three-dimensional semiconductor memory device according to some example embodiments of the present inventive concepts.

Referring to FIG. 6, there may be an illustration of one of the vertical structures VS each of which includes the source structure SC including the first and second source conductive patterns SCP1 and SCP2, the data storage pattern DSP, the vertical semiconductor pattern VSP, the buried dielectric pattern VI, and a lower data storage pattern DSPr. A single vertical structure VS will be explained below. The following description will also be applicable to other vertical structures VS.

The data storage pattern DSP may include a blocking dielectric layer BLK, a charge storage layer CIL, and a tunneling dielectric layer TIL that are sequentially stacked. The blocking dielectric layer BLK may be adjacent to the stack structure ST or the source structure SC, and the tunneling dielectric layer TIL may be adjacent to the vertical semiconductor pattern VSP. The charge storage layer CIL may be interposed between the blocking dielectric layer BLK and the tunneling dielectric layer TIL. The blocking dielectric layer BLK, the charge storage layer CIL, and the tunneling dielectric layer TIL may extend in the third direction D3 between the stack structure ST and the vertical semiconductor pattern VSP. The data storage pattern DSP may store and/or change data by using Fowler-Nordheim tunneling induced by a voltage difference between the vertical semiconductor pattern VSP and the gate electrodes EL. For example, the blocking dielectric layer BLK and the tunneling dielectric layer TIL may include silicon oxide, and the charge storage layer CIL may include silicon nitride or silicon oxynitride.

The first source conductive pattern SCP1 of the source structure SC may be in contact with the vertical semiconductor pattern VSP, and the second source conductive pattern SCP2 of the source structure SC may be spaced apart from the vertical semiconductor pattern VSP across the data storage pattern DSP. The first source conductive pattern SCP1 may be spaced apart from the buried dielectric pattern VI across the vertical semiconductor pattern VSP.

For example, the first source conductive pattern SCP1 may include protrusions SCP1bt located at a level higher than that of a bottom surface SCP2b of the second source conductive pattern SCP2 or lower than that of a bottom surface SCP1b of the first source conductive pattern SCP1. However, the protrusions SCP1bt may be located at a level lower than that of a top surface SCP2a of the second source conductive pattern SCP2. The protrusions SCP1bt may each have, for example, a curved shape at a surface in contact with the data storage pattern DSP or the lower data storage pattern DSPr.

Figure 7:
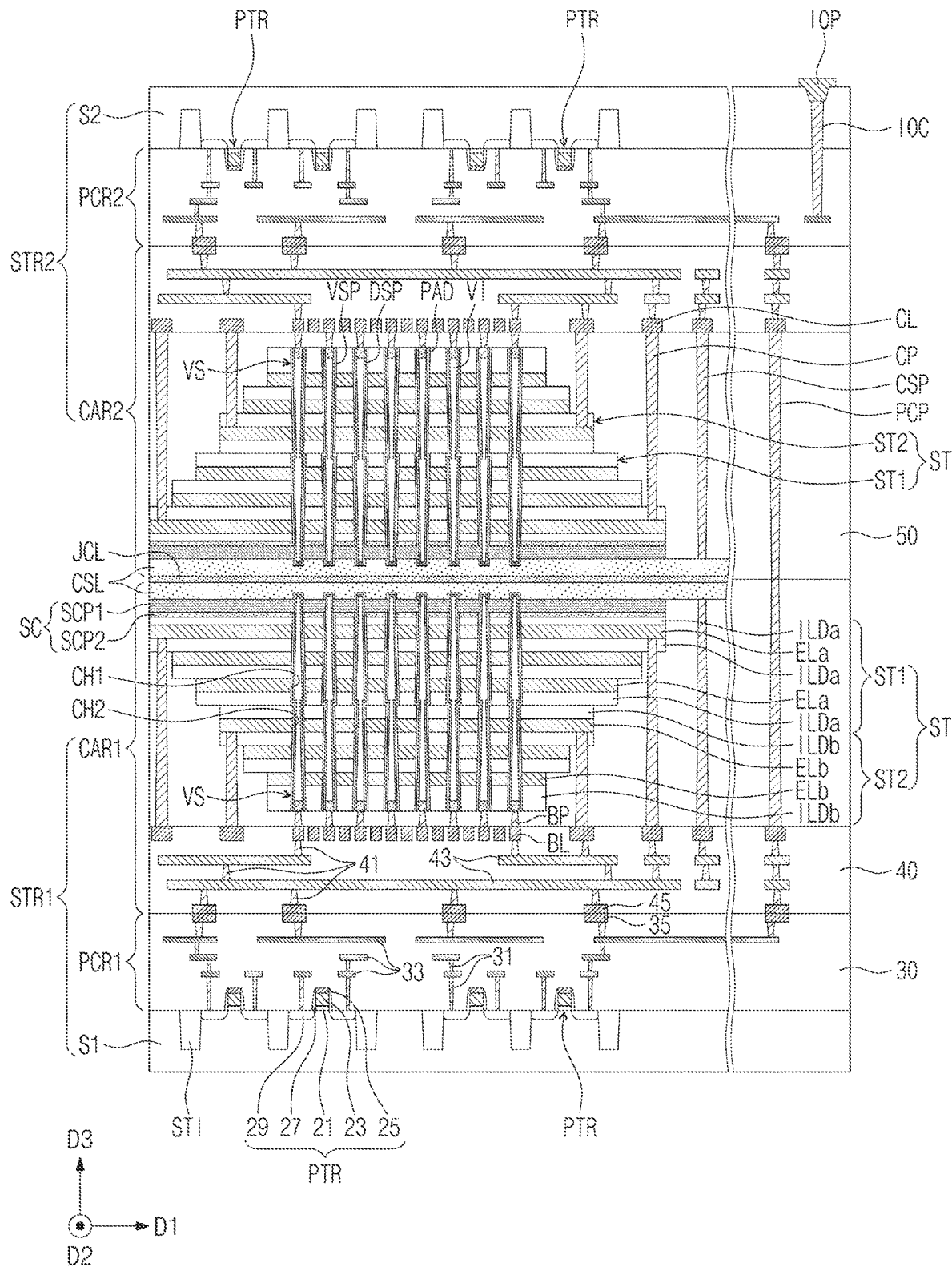
FIG. 7 illustrates a cross-sectional view showing a three-dimensional semiconductor memory device according to some example embodiments of the present inventive concepts.

FIG. 7 illustrates an enlarged cross-sectional view of a part of FIG. 4, showing a three-dimensional semiconductor memory device according to some example embodiments of the present inventive concepts. For convenience of description, omission will be made to avoid repetitive explanations of features substantially the same as those discussed with reference to FIG. 5.

A junction conductive layer JCL may be provided between the common source region CSL of the first cell array region CAR1 and the common source region CSL of the second cell array region CAR2. The junction conductive layer JCL may include, for example, silicon (Si), germanium (Ge), or a mixture thereof. The junction conductive layer JCL may have a thickness in the third direction D3 less than a thickness in the third direction D3 of the common source region CSL. A second thickness T2 may be defined to refer to an overall thickness in the third direction D3 of the source structure SC and the common source region CSL included in the first cell array region CAR1, the source structure SC and the common source region CSL included in the second cell array region CAR2, and the junction conductive layer JCL. The second thickness T2 may be greater than that in the case of FIG. 5.

FIGS. 8 to 11 illustrate cross-sectional views showing a method of fabricating a three-dimensional semiconductor memory device according to some example embodiments of the present inventive concepts. With reference to FIGS. 5 and 8 to 11, it will be discussed in detail a method of fabricating a three-dimensional semiconductor memory device according to some example embodiments of the present inventive concepts.

Figure 8:
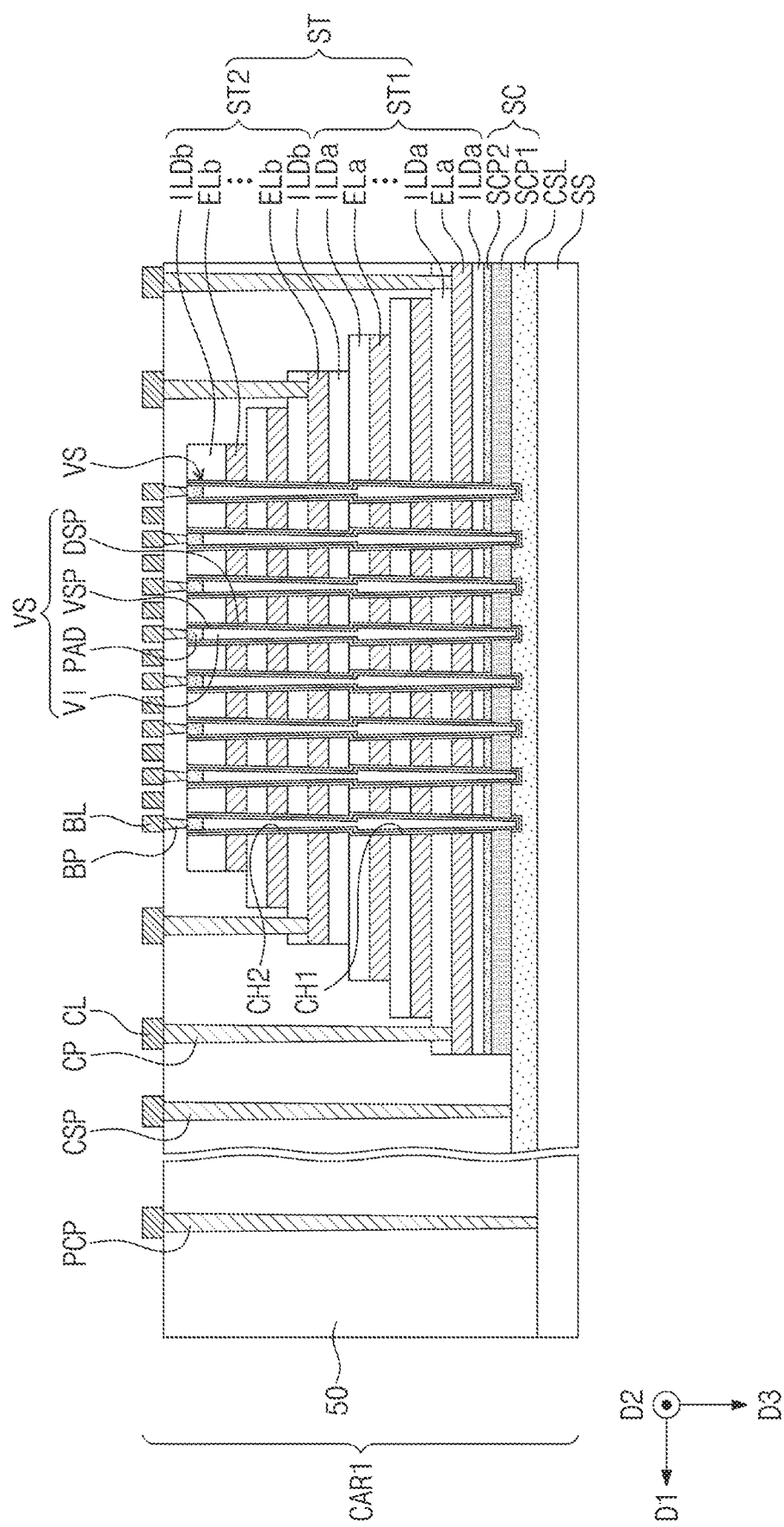
FIGS. 8 to 11 illustrate cross-sectional views showing a method of fabricating a three-dimensional semiconductor memory device according to some example embodiments of the present inventive concepts.

Referring to FIG. 8, a source structure SC, a stack structure ST, and a second dielectric layer 50 covering or overlapping the source and stack structures SC and ST may be formed on a sacrificial substrate SS that includes a common source region CSL. The sacrificial substrate SS may be a wafer on which a semiconductor circuit can be integrated. The sacrificial substrate SS may be, for example, a silicon substrate, a silicon-germanium substrate, a germanium substrate, or a monocrystalline epitaxial layer grown on a monocrystalline silicon substrate. The common source region CSL may be formed in the sacrificial substrate SS and may have a conductivity type (e.g., N-type) different from that of the sacrificial substrate SS. The common source region CSL may be formed by doping impurities into an upper portion of the sacrificial substrate SS or depositing an impurity-doped material on the sacrificial substrate SS. For example, the common source region CSL may be formed by deposing an impurity-doped semiconductor material on the sacrificial substrate SS and performing an annealing process.

A first sacrificial layer and a second source conductive pattern SCP2 may be sequentially formed on the sacrificial substrate SS. First interlayer dielectric layers ILDa and second sacrificial layers may be alternately stacked on the second source conductive pattern SCP2. First vertical channels CH1 may be formed to penetrate in a third direction D3 through the first sacrificial layer, the second source conductive pattern SCP2, the first interlayer dielectric layers ILDa, and the second sacrificial layers. Second interlayer dielectric layers ILDb and third sacrificial layers may be alternately stacked on an uppermost one of the first interlayer dielectric layers ILDa. Second vertical channels CH2 may be formed to penetrate in the third direction D3 through the second interlayer dielectric layers ILDb and the third sacrificial layers.

A data storage pattern DSP and a vertical semiconductor pattern VSP may be sequentially formed to conformally cover, contact, or overlap an inner wall of each of the first and second vertical channels CH1 and CH2. A buried dielectric pattern VI and a conductive pad PAD may be formed in an inner space of each of the first and second vertical channels CH1 and CH2, which inner space is surrounded by the vertical semiconductor pattern VSP.

After the formation of the first and second vertical channels CH1 and CH2, a through hole may be formed to penetrate the first to third sacrificial layers and the first and second interlayer dielectric layers ILDa and ILDb. The through hole may extend in the third direction D3, and may provide a space in which a separation structure 4440 is subsequently formed as shown in FIG. 3. The first to third sacrificial layers may be removed which are exposed to the through hole. For example, the data storage pattern DSP may be partially removed when removing the first sacrificial layer between the second source conductive pattern SCP2 and the sacrificial substrate SS. A first source conductive pattern SCP1 may be formed to at least partially or completely fill a space from which the first sacrificial layer is removed. The first source conductive pattern SCP1 may contact a portion of the vertical semiconductor pattern VSP. First and second gate electrodes ELa and ELb may be formed to fill spaces from which the second and third sacrificial layers are removed. A first stack structure ST1 may be formed which includes the first gate electrodes ELa and the first interlayer dielectric layers ILDa, and a second stack structure ST2 may be formed which includes the second gate electrodes ELb and the second interlayer dielectric layers ILDb.

The first and second stack structures ST1 and ST2 may each be patterned to have a stepwise structure in a first direction D1 or in a direction opposite to the first direction D1. The second dielectric layer 50 may be formed on and/or cover, contact, or overlap the first and second stack structures ST1 and ST2. Afterwards, bit-line contact plugs BP, cell contact plugs CP, a common source contact plug CSP, and a peripheral connection contact plug PCP may be formed to penetrate the second dielectric layer 50. The common source contact plug CSP may, for example, penetrate the second dielectric layer 50 to come into contact with the common source region CSL of the sacrificial substrate SS. The peripheral connection contact plug PCP may penetrate the second dielectric layer 50.

On the second dielectric layer 50, bit lines BL may be formed to have connections with corresponding bit-line contact plugs BP, and conductive lines CL may be formed to have connections with corresponding cell contact plugs CP, the common source plugs CSP, and the peripheral connection contact plug PCP.

Figure 9:
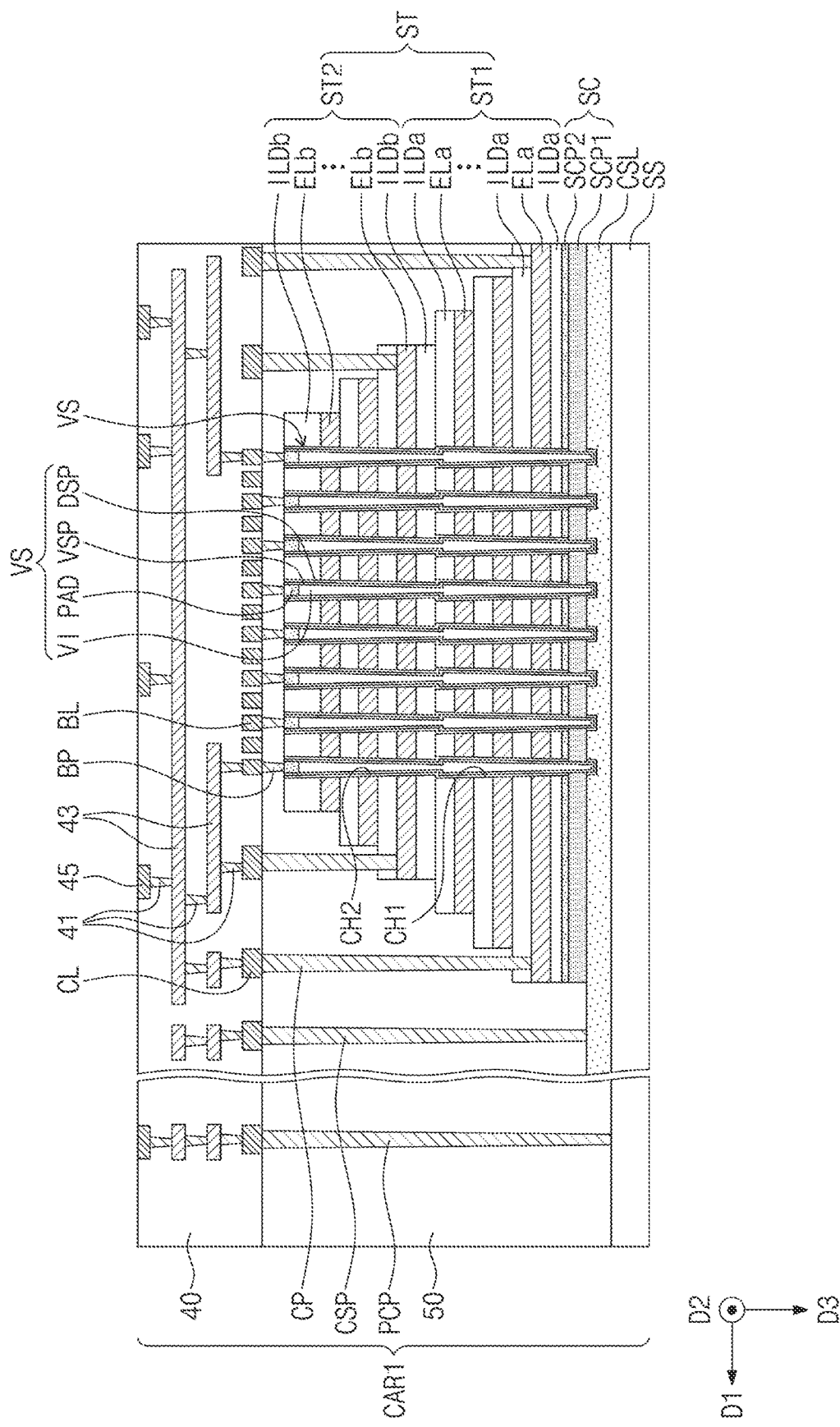

Referring to FIG. 9, a first dielectric layer 40 may be formed on the second dielectric layer 50. Connection contact plugs 41, connection circuit lines 43, and second bonding pads 45 may be formed in the first dielectric layer 40. The connection circuit lines 43 are electrically connected through the connection contact plugs 41 to the bit lines BL or the conductive lines CL.

Figure 10:
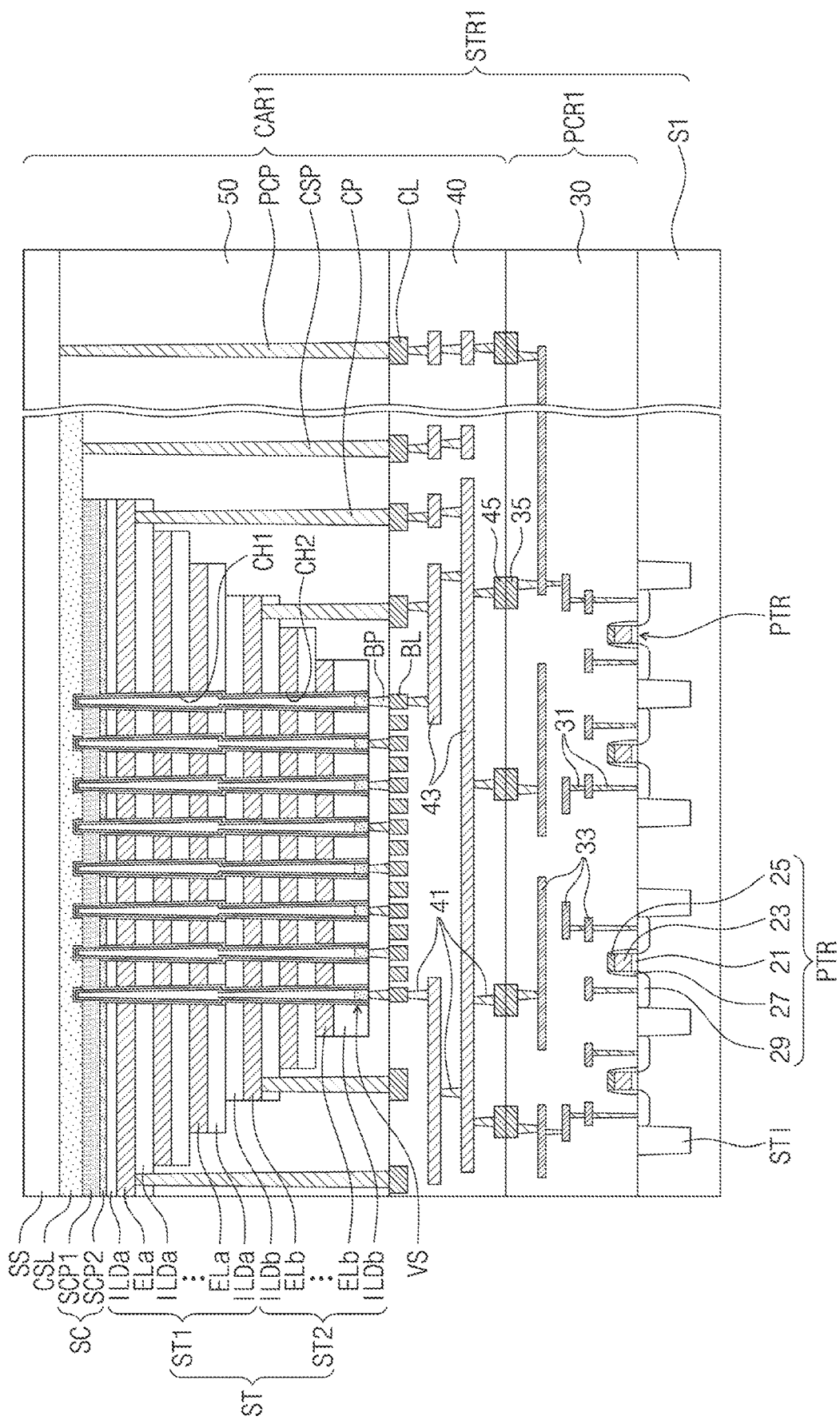

Referring to FIG. 10, a first cell array region CAR1 formed on the sacrificial substrate SS may be bonded with a first peripheral circuit region PCR1 formed on the first substrate S1. The sacrificial substrate SS may be provided on the first substrate S1 so as to allow the first peripheral circuit region PCR1 to face the first cell array region CAR1. The second bonding pads 45 of the first cell array region CAR1 may be in contact with and/or merged with the first bonding pads 35 of the first peripheral circuit region PCR1. The first cell array region CAR1 on the sacrificial substrate SS and the first peripheral circuit region PCR1 on the first substrate S1 may be bonded with each other to form a first structure STR1.

Figure 11:
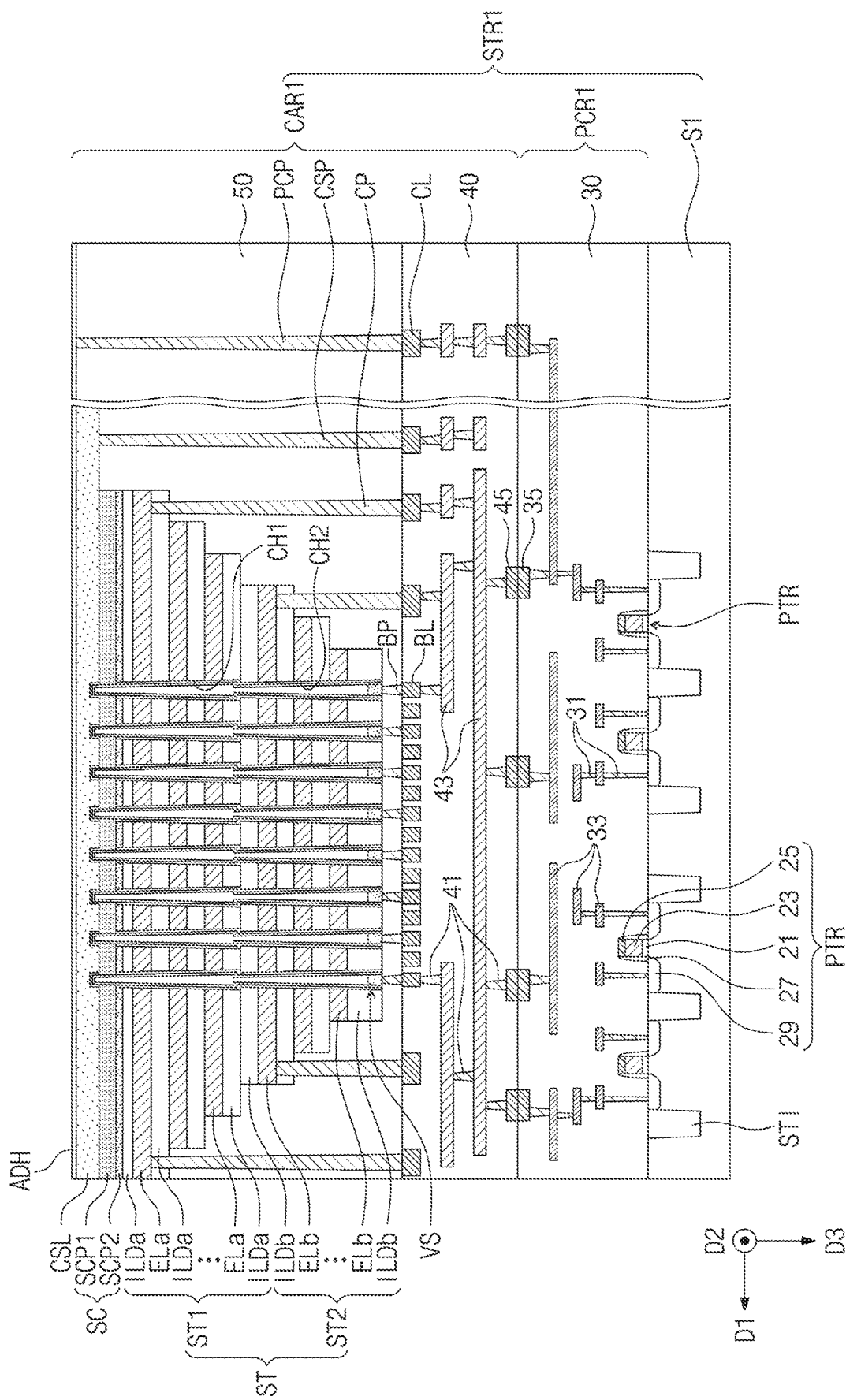

Referring to FIG. 11, the sacrificial substrate SS may be partially removed to expose the common source region CSL in the sacrificial substrate SS. An adhesive layer ADH may be formed on the common source region CSL. The adhesive layer ADH may include a hydrophilic material, such as $NH_4OH$, $HNO_3$, or $H_2SO_4$. For example, before the adhesive layer ADH is formed on the common source region CSL, the common source region CSL may be oxidized at a portion that is externally exposed. The partial oxidation of the common source region CSL may increase an adhesive force.

Referring back to FIG. 5, the first structure STR1 may be joined with a second structure STR2 formed by substantially the same method used for forming the first structure STR1 discussed with reference to FIGS. 8 to 11. An annealing process may be performed after the common source region CSL of the first structure STR1 is positioned to face the common source region CSL of the second structure STR2. After the annealing process, the adhesive layer ADH of FIG. 11 may disappear due to integration with the common source regions CSL of the first and second structures STR1 and STR2.

According to embodiments related to FIG. 7, before the first and second structures STR1 and STR2 are joined with each other, a junction conductive layer JCL may be formed on the common source region CSL of one of the first and second structures STR1 and STR2.

At least four wafers may be used to fabricate a semiconductor chip (see 2201 or 2202 of FIGS. 3 and 4) that includes a three-dimensional semiconductor memory device according to some example embodiments of the present inventive concepts. At least two wafers may be used to fabricate each of the first and second structures STR1 and STR2.

As the first and second structures STR1 and STR2 are joined with each other according to the present inventive concepts, a three-dimensional semiconductor memory device may increase in cell capacity per unit area. In addition, a peripheral circuit may be disposed on each of upper and lower sides, such that the three-dimensional semiconductor memory device may decrease in total area. Moreover, because a cell array and a peripheral circuit are formed individually of each other and then bonded with each other, the peripheral transistors PTR may be prevented from being damaged caused by various kinds of annealing processes, and accordingly may increase in reliability and electrical characteristics.

For a three-dimensional semiconductor memory device according to some example embodiments of the present inventive concepts, structures each including a cell array may be joined with each other to increase cell capacity per unit area.

Moreover, the three-dimensional semiconductor memory device according to some example embodiments of the present inventive concepts may decrease its area because a peripheral circuit is disposed on each of upper and lower sides.

Furthermore, a cell array and a peripheral circuit may be formed individually of each other and then bonded with each other, and thus transistors may be prevented from being damaged as caused by various kinds of annealing processes, which may result in an increase in reliability and electrical characteristics.

Although the present invention has been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A three-dimensional semiconductor memory device, comprising:
    a first structure; and
    a second structure in contact with the first structure,
    wherein each of the first and second structures comprises:
        a substrate;
        a peripheral circuit region on the substrate; and
        a cell array region comprising a stack structure on the peripheral circuit region, a plurality of vertical structures that penetrate the stack structure, and a common source region in contact with the vertical structures,
    wherein the stack structure is between the peripheral circuit region and the common source region,
    wherein the common source regions of the first and second structures are connected with each other, and
    wherein the three-dimensional semiconductor memory device further comprises a junction conductive layer between the common source region of the first structure and the common source region of the second structure.

2. The three-dimensional semiconductor memory device of claim 1,
    wherein the peripheral circuit region comprises:
        a plurality of peripheral transistors on the substrate; and
        a plurality of first bonding pads connected to respective ones of the peripheral transistors,
    wherein the cell array region further comprises:
        a plurality of bit lines connected to respective ones of the vertical structures;
        a plurality of conductive lines spaced apart in a horizontal direction from the bit lines; and
        a plurality of second bonding pads connected to the bit lines or the conductive lines, and
    wherein each of the first bonding pads is integrally bonded with respective ones of the second bonding pads.

3. The three-dimensional semiconductor memory device of claim 2, wherein the cell array region further comprises a source conductive pattern between the stack structure and the common source region,
    wherein each of the vertical structures is in a respective vertical channel that penetrates the stack structure,
    wherein each of the vertical structures comprises:
        a data storage pattern that conformally covers an inner wall of the respective vertical channel; and
        a vertical semiconductor pattern surrounded by the data storage pattern, and
    wherein the source conductive pattern is in contact with a sidewall of the vertical semiconductor pattern.

4. The three-dimensional semiconductor memory device of claim 3,
    wherein the respective vertical channel comprises a first vertical channel and a second vertical channel connected to the first vertical channel, and wherein the first vertical channel and the second vertical channel have different diameters at a boundary where the first and second vertical channels are connected to each other.

5. The three-dimensional semiconductor memory device of claim 3, wherein the cell array region further comprises:
a dielectric layer on the stack structure; and
a common source contact plug that penetrates the dielectric layer and connects one of the conductive lines to the common source region.

6. The three-dimensional semiconductor memory device of claim 5,
wherein the cell array region of each of the first and second structures further comprises a peripheral connection contact plug that penetrates the dielectric layer and the common source region and is electrically connected to the peripheral circuit region,
wherein the peripheral connection contact plug is spaced apart from the stack structure, the common source region, and the common source contact plug, and
wherein the peripheral connection contact plug of the first structure and the peripheral connection contact plug of the second structure are in contact with each other.

7. The three-dimensional semiconductor memory device of claim 3, wherein an overall thickness of the common source regions of the first and second structures, and the source conductive pattern in the first structure and the source conductive pattern in the second structure is about 2 to 4 times a thickness of one of the common source region of the first structure or the common source region of the second structure.

8. The three-dimensional semiconductor memory device of claim 3, wherein an overall thickness of the common source regions of the first and second structures and the source conductive pattern in the first structure and the source conductive pattern in the second structure is in a range of about 10 kÅ to about 40 kÅ.

9. The three-dimensional semiconductor memory device of claim 1, wherein the common source region has a plate shape extending parallel to a top surface of the substrate.

10. The three-dimensional semiconductor memory device of claim 1,
wherein the stack structure comprises a plurality of interlayer dielectric layers and a plurality of gate electrodes that are alternately stacked and extend in a direction parallel to a top surface of the substrate, and
wherein the gate electrodes have respective lengths that increase with increasing distances of respective ones of the gate electrodes from the substrate.

11. The three-dimensional semiconductor memory device of claim 10,
wherein each of the vertical structures has a respective width that increases with increasing distance from the common source region, and
wherein the gate electrodes of the stack structure have respective lengths in the direction that decrease with increasing distances from the common source region.

12. The three-dimensional semiconductor memory device of claim 1, wherein a thickness of the junction conductive layer is less than a thickness of the common source region of the first structure and the common source region of the second structure.

13. A three-dimensional semiconductor memory device, comprising:
a first structure; and
a second structure in contact with the first structure, wherein each of the first and second structures comprises:

a substrate;
a peripheral circuit region comprising a plurality of peripheral transistors on the substrate, a plurality of peripheral circuit lines on the peripheral transistors, and a plurality of first bonding pads connected to the peripheral transistors through the peripheral circuit lines; and
a cell array region comprising a plurality of second bonding pads which are integrally bonded with respective ones of the first bonding pads of the peripheral circuit region, a plurality of connection circuit lines on the second bonding pads, a plurality of bit lines connected to the second bonding pads through the connection circuit lines, a stack structure on the bit lines, a plurality of vertical structures that penetrate the stack structure, a common source region in contact with the vertical structures, and a source conductive pattern between the stack structure and the common source region,
wherein the stack structure is between the peripheral circuit region and the common source region,
wherein the common source regions of the first and second structures are connected to each other,
wherein each of the vertical structures is in a respective vertical channel that penetrates the stack structure,
wherein each of the vertical structures comprises a data storage pattern that conformally covers an inner wall of the respective vertical channel and a vertical semiconductor pattern surrounded by the data storage pattern,
wherein the data storage pattern comprises a blocking dielectric layer, a charge storage layer, and a tunneling dielectric layer that are sequentially stacked, and
wherein the source conductive pattern is in contact with the vertical semiconductor pattern.

14. The three-dimensional semiconductor memory device of claim 13,
wherein the stack structure comprises a plurality of interlayer dielectric layers and a plurality of gate electrodes that are alternately stacked and extend in a direction parallel to a top surface of the substrate, and
wherein the gate electrodes have respective lengths that increase with increasing distance from the substrate.

15. The three-dimensional semiconductor memory device of claim 13, wherein the first bonding pads and the second bonding pads comprise copper (Cu).

16. The three-dimensional semiconductor memory device of claim 13,
wherein the respective vertical channel comprises a first vertical channel and a second vertical channel connected to the first vertical channel, and
wherein the first vertical channel and the second vertical channel have different diameters at a boundary where the first and second vertical channels are connected to each other.

17. The three-dimensional semiconductor memory device of claim 13,
wherein the cell array region of each of the first and second structures further comprises a peripheral connection contact plug that penetrates the common source region, and
wherein the peripheral connection contact plug of the first structure and the peripheral connection contact plug of the second structure contact each other and electrically connect the peripheral circuit region of the first structure with the peripheral circuit region of the second structure.

18. An electronic system, comprising:

a three-dimensional semiconductor memory device that comprises a first structure, a second structure, and an input/output pad, wherein each of the first and second structures comprises:
- a substrate;
- a peripheral circuit region on the substrate; and
- a cell array region comprising a stack structure on the peripheral circuit region, a plurality of vertical structures that penetrate the stack structure, and a common source region in contact with the vertical structures, wherein the input/output pad is connected to the peripheral circuit region of the second structure; and a controller that is electrically connected to the three-dimensional semiconductor memory device through the input/output pad and is configured to control the three-dimensional semiconductor memory device, wherein the stack structure is between the peripheral circuit region and the common source region, wherein the common source regions of the first and second structures are connected with each other, wherein the cell array region further comprises a source conductive pattern between the stack structure and the common source region, and wherein the source conductive pattern is in contact with a sidewall of the vertical structure.

19. The electronic system of claim 18, wherein the peripheral circuit region comprises a plurality of peripheral transistors on the substrate, and a plurality of first bonding pads connected to respective ones of the peripheral transistors, wherein the cell array region further comprises a plurality of bit lines connected to respective ones of the vertical structures, a plurality of conductive lines spaced apart in a horizontal direction from the bit lines, and a plurality of second bonding pads connected to the bit lines or the conductive lines, and wherein each of the first bonding pads is integrally bonded with a respective one of the second bonding pads.

* * * * *